(12) United States Patent
Patti et al.

(10) Patent No.: US 9,240,457 B2
(45) Date of Patent: Jan. 19, 2016

(54) IGBT TRANSISTOR WITH PROTECTION AGAINST PARASITIC COMPONENT ACTIVATION AND MANUFACTURING PROCESS THEREOF

(71) Applicant: STMicroelectronics S.r.l., Agrate Brianza (MB) (IT)

(72) Inventors: Davide Giuseppe Patti, Mascalucia (IT); Giuditta Settanni, Catania (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 133 days.

(21) Appl. No.: 14/162,200

(22) Filed: Jan. 23, 2014

(65) Prior Publication Data
US 2014/0134807 A1 May 15, 2014

Related U.S. Application Data

(60) Division of application No. 13/211,650, filed on Aug. 17, 2011, which is a continuation of application No. 12/300,136, filed as application No. PCT/IT2006/000350 on May 11, 2006, now abandoned.

(51) Int. Cl.
*H01L 21/332* (2006.01)
*H01L 29/66* (2006.01)
*H01L 29/10* (2006.01)
*H01L 29/739* (2006.01)

(52) U.S. Cl.
CPC ...... *H01L 29/66333* (2013.01); *H01L 29/1095* (2013.01); *H01L 29/66325* (2013.01); *H01L 29/7395* (2013.01)

(58) Field of Classification Search
CPC ............... H01L 29/1095; H01L 29/66333; H01L 29/7395; H01L 29/66325
USPC ........... 257/139, E21.382, E29.197; 438/135, 438/128
See application file for complete search history.

(56) References Cited

U.S. PATENT DOCUMENTS

| | | | |
|---|---|---|---|
| 4,809,047 A | 2/1989 | Temple | |
| 5,034,336 A | 7/1991 | Seki | |
| 5,164,327 A * | 11/1992 | Maruyama | H01L 29/66712 257/E21.383 |
| 5,397,905 A | 3/1995 | Otsuki et al. | |
| 5,701,023 A * | 12/1997 | Bulucea | H01L 29/7808 257/139 |

FOREIGN PATENT DOCUMENTS

EP 0 616 369 9/1994

OTHER PUBLICATIONS

International Search Report, dated Nov. 3, 2006, from corresponding International Application No. PCT/IT2006/000350.

* cited by examiner

*Primary Examiner* — Vongsavanh Sengdara
(74) *Attorney, Agent, or Firm* — Allen, Dyer, Doppelt, Milbrath & Gilchrist, P.A.

(57) ABSTRACT

An IGBT transistor includes a drift region, at least one body region housed in the drift region and having a first type of conductivity, and a conduction region, which crosses the body region in a direction perpendicular to a surface of the drift region and has the first type of conductivity and a lower resistance than the body region. The conduction region includes a plurality of implant regions, arranged at respective depths from the surface of the drift region.

12 Claims, 6 Drawing Sheets

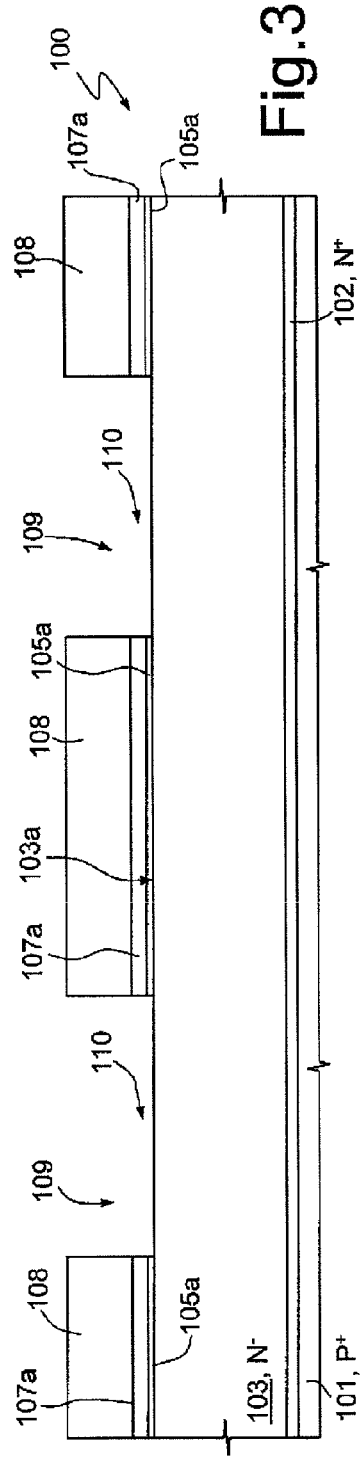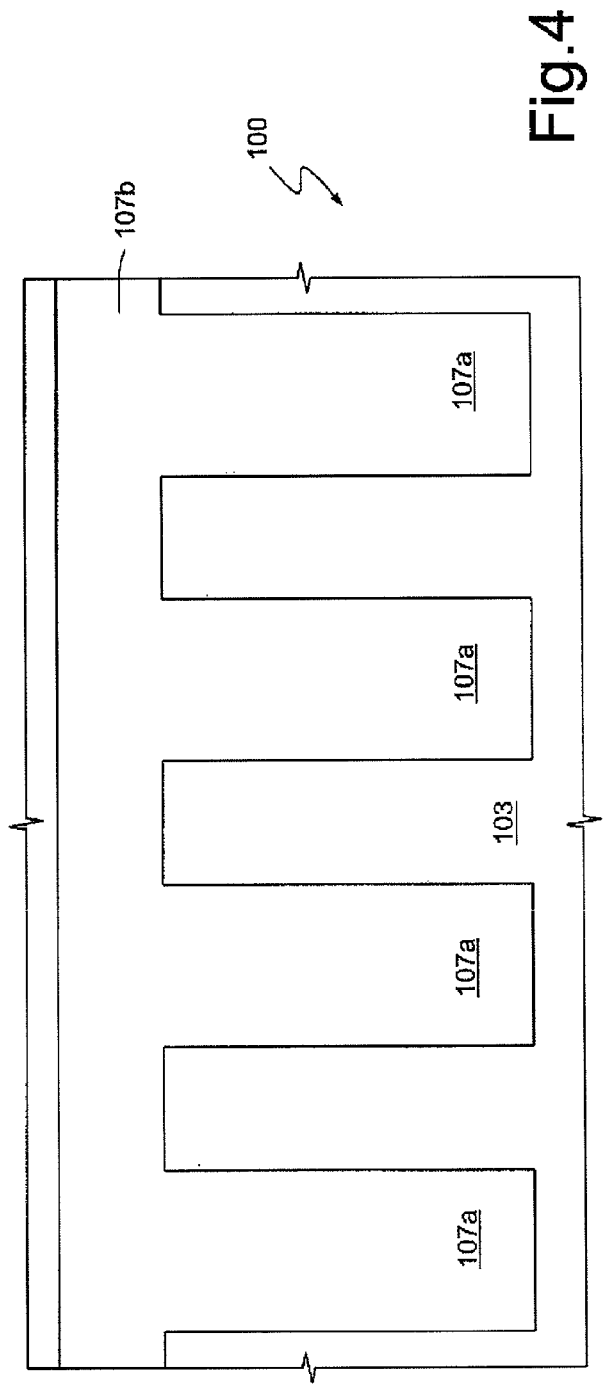

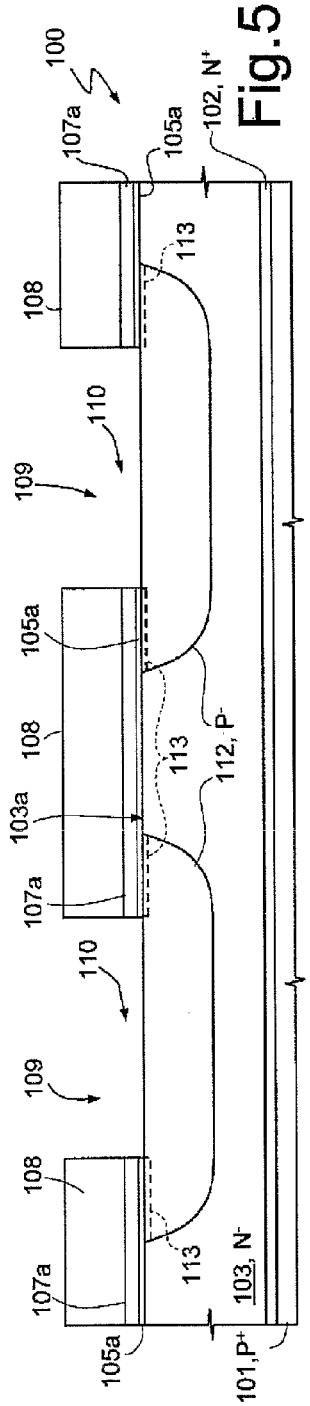
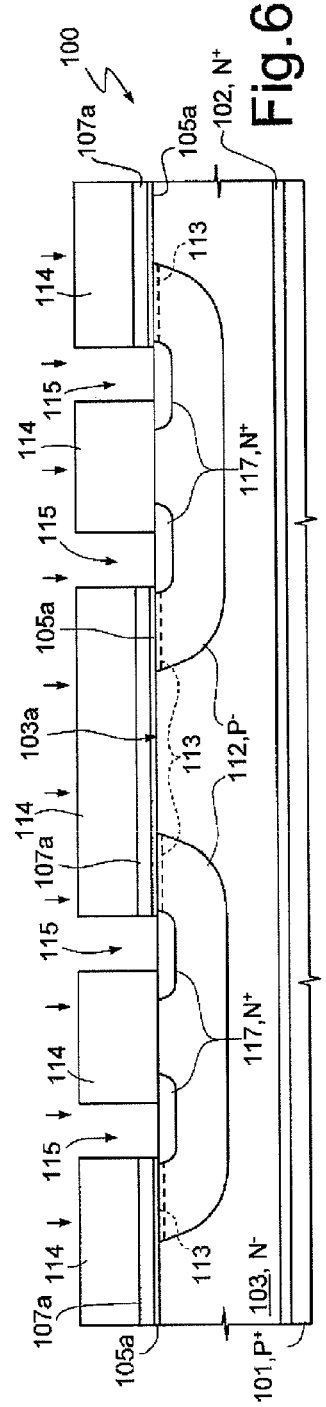
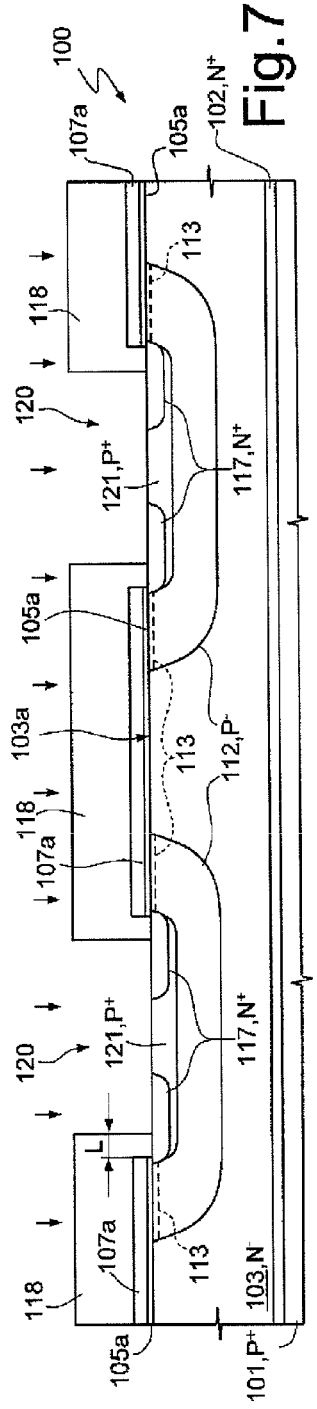

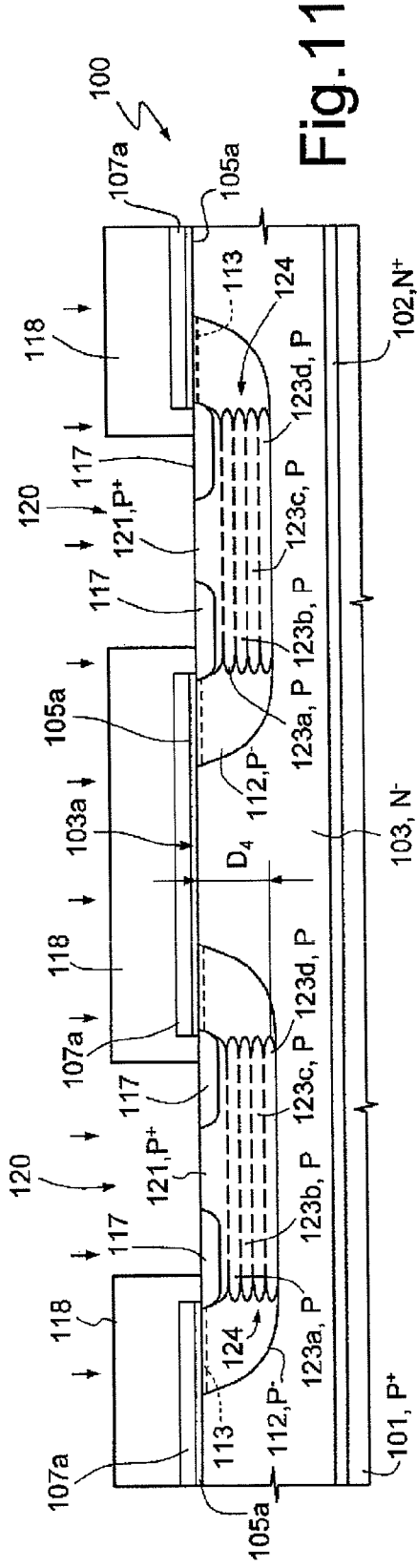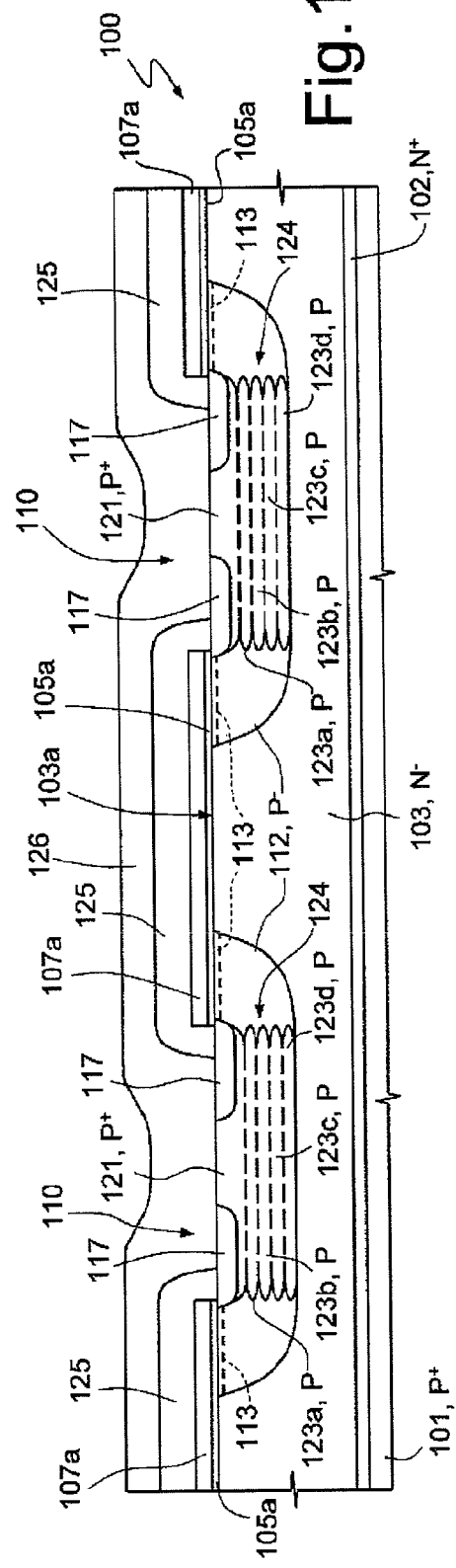

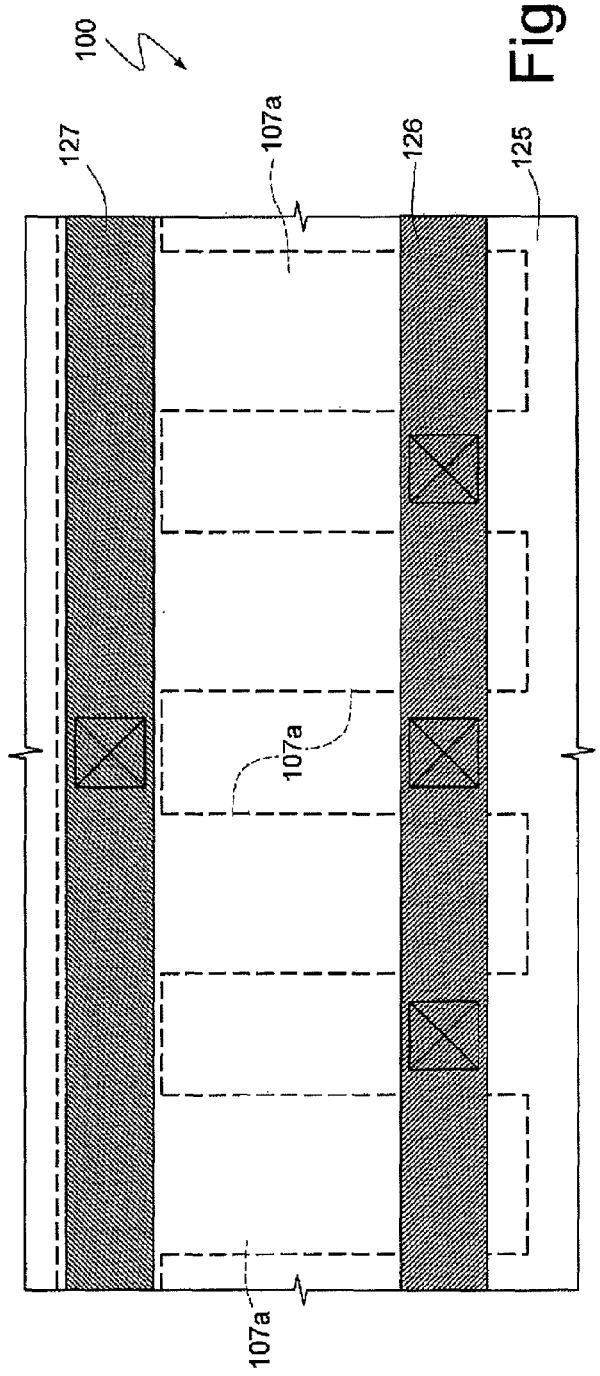
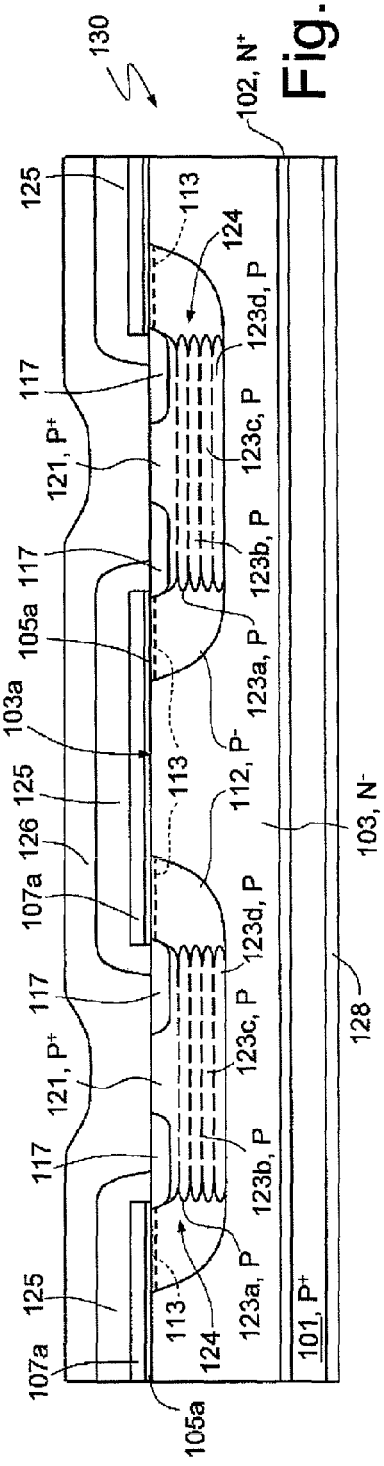

IGBT TRANSISTOR WITH PROTECTION AGAINST PARASITIC COMPONENT ACTIVATION AND MANUFACTURING PROCESS THEREOF

CROSS REFERENCE TO RELATED APPLICATIONS

This application is a divisional of U.S. application Ser. No. 13/211,650 filed Aug. 17, 2011, which application is a continuation of U.S. application Ser. No. 12/300,136 filed Mar. 24, 2009, which application is a national phase of International patent application number PCT/IT2006/000350 filed on 11 May 2006, which applications are hereby incorporated by reference to the maximum extent allowable by law.

TECHNICAL FIELD

The present invention relates to an IGBT transistor with protection against activation of parasitic components and to a manufacturing process thereof.

BACKGROUND ART

As is known, in IGBT transistors the maximum current in the conduction state is limited by the presence of an intrinsic parasitic thyristor. For greater clarity, reference may be made to FIG. 1, which shows the structure of a conventional IGBT transistor, designated by the reference number 1. The IGBT transistor 1 comprises a drift region 2 of an $N^-$-type, a body region 3, of a $P^-$-type. In turn the body region 3 houses two symmetrical source regions 5, of an $N^+$-type. The body region 3 and the source regions 5 are aligned to a surface 2a of the drift region 2 and are contacted by an emitter line 7. Gate regions 8 are arranged on the surface 2a, at sides of and partly overlying the body region 3, and are separated from the underlying structures by gate-oxide regions 9. More precisely, the gate regions 8 are each aligned to a respective one of the source regions 5, and portions of the body region 3 immediately underlying the gate regions 8 define channel regions 10. The gate regions 8 are directly connected to one another and are provided with a gate terminal (not shown). The IGBT transistor 1 further comprises a collector region 12, of a $P^+$-type, separated from the drift region 2 by a transition region 13, of an $N^+$-type. Finally, a collector contact 15 coats the collector region 13 throughout its extension.

From an electrical standpoint, the body region 3, the drift region 2, and the collector region 13 define a PNP transistor 17, controlled by an NMOS transistor 18 formed by the source regions 5, the body region 3 (in particular, the channel regions 10) and the drift region 2. In addition, a further parasitic NPN transistor 19 is present, formed by the source regions 5, the body region 3 (outside the channel regions 10) and, once again, the drift region 2. In practice, the PNP transistor 17, the MOS transistor 18 and the NPN transistor 19 form a thyristor 20. In use, the current of the IGBT transistor 1 is substantially determined by a conduction current $I_D$ (of holes, in this case) of the PNP transistor 17 and by a control current $I_C$ (of electrons), which flows through the NMOS transistor 18. The NPN transistor 19 should be normally off. The body region 3, however, has a low doping level and hence a relatively high internal resistance $R_f$. Consequently, the conduction current $I_D$ may cause a voltage drop between the source regions 5 and the body region 3 (which form the emitter and the base, respectively, of the NPN transistor 19) such as to turn the NPN transistor 19 on. In this case, the thyristor 20 is activated, and the current flows directly towards the emitter line 7, independently of the MOS transistor 18, and hence can no longer be controlled by means of the gate terminal 11. In addition, activation of the transistor 20 limits the maximum current of the IGBT transistor 1, especially at high temperatures.

In order to overcome this problem, it has been proposed to reduce the resistance of the body region 3 by means of deep diffusion of a dopant species. In particular, the treatment concerns that portion of the body region 3 where mainly the conduction current $I_D$ is present. The dopant species is introduced through the openings between the gate regions 8 and diffuses towards the drift region 2. However, the diffusion is substantially isotropic and hence can easily alter doping of the channel region 10, in effect increasing the threshold voltage of the MOS transistor 18. The phenomenon hence limits the depth that the diffusion can reach and, consequently, also the benefit that can be achieved.

According to an alternative solution, a shallow implantation self-aligned to the gate regions 20 is performed and is followed by a diffusion for a short time. In this way, doping of the channel regions 10 and the value of the threshold voltage of the MOS transistor 18 are preserved, but it is possible to obtain only a modest reduction in the resistance of the body region 3.

SUMMARY OF THE INVENTION

According to one embodiment, the present invention provides an IGBT transistor and a manufacturing process thereof which will overcome at least some of the limitations described.

According to one embodiment, there is provided an IGBT transistor comprising a drift region, at least one body region housed in said drift region and having a first type of conductivity, and a conduction region crossing said body region in a direction perpendicular to a surface of said drift region and having said first type of conductivity and a lower resistance than said body region, characterized in that said conduction region comprises a plurality of implant regions arranged at respective depths from said surface of said drift region and a process for manufacturing an IGBT transistor comprising the steps of providing, in a semiconductor wafer, a drift region forming, in said drift region, at least one body region having a first type of conductivity, and forming a conduction region crossing said body region in a direction perpendicular to a surface of said drift region and having said first type of conductivity and a resistance lower than that of said body region, characterized in that said step of forming said conduction region comprises carrying out a plurality of implantations of dopant species in said body region at respective depths from said surface of said drift region.

BRIEF DESCRIPTION OF THE DRAWINGS

For a better understanding of the invention, an embodiment thereof will now be described, purely by way of non-limiting example, with reference to the attached drawings, wherein:

FIGS. 2 and 3 are cross-sectional views through a semiconductor wafer, in successive steps of a process of fabrication according to the present invention;

FIG. 4 is a top plan view of the wafer of FIG. 3, at a different scale;

FIGS. 5-12 show the same view as that of FIGS. 2 and 3, in successive fabrication steps;

FIG. 13 is a top plan view of the wafer of FIG. 12, at a different scale; and

FIG. 14 is a cross-sectional view through an IGBT transistor according to the present invention.

DETAILED DESCRIPTION

Figure 1:
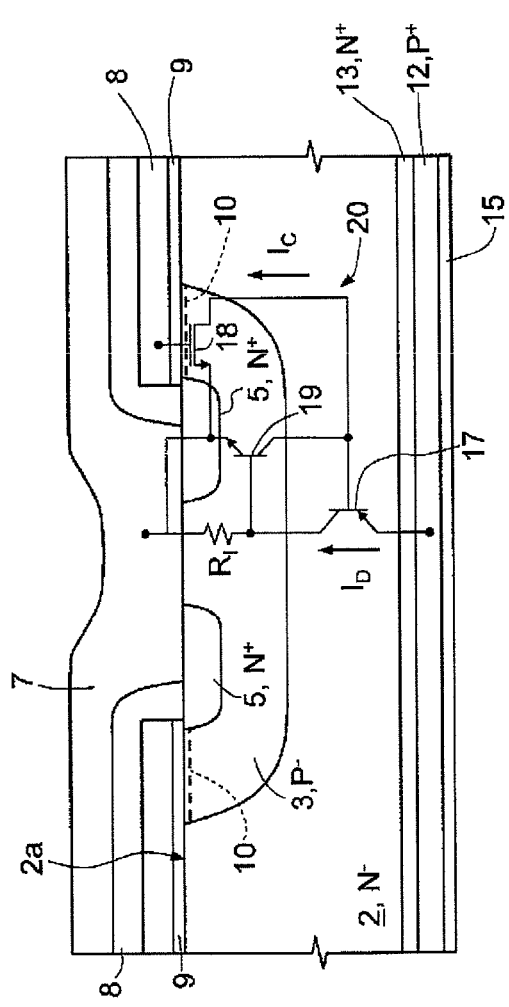
FIG. 1 is a cross-sectional view through a known IGBT transistor.
Figure 2:
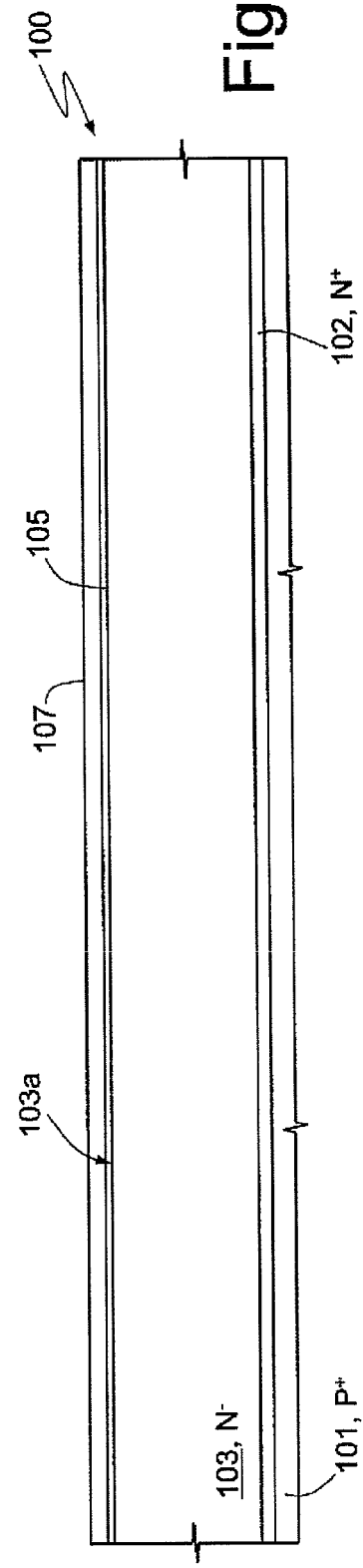
Figure 8:
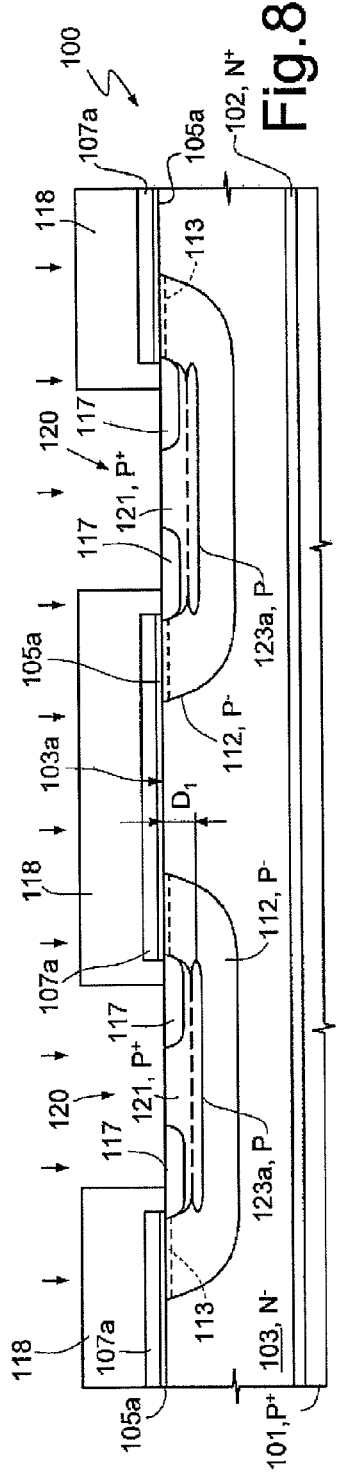

With reference to FIG. 2, number 100 designates a semiconductor wafer comprising a substrate 101, which in the embodiment described herein has a P$^+$-type conductivity. By an epitaxial growth, a transition region 102, of an N$^+$-type, and a drift region 103, of an N$^{31}$-type, are made in succession starting from the substrate 101. For example, the drift region 103 has a doping level of approximately $10^{14}$ atoms/cm$^3$. Then, a gate-oxide layer 105, having a thickness of some hundreds of nanometers, is formed on the free surface 103a of the drift region 103, by means of a thermal oxidation of short duration. Then, a conductive polysilicon layer 107 is deposited on the wafer 100.

As is shown in FIG. 3, a resist layer is deposited and delineated so as to form a first mask 108 having first windows 109, in the form of strips that extend perpendicular to the plane of the drawing. The conductive layer 107 and the gate-oxide layer 105 are etched and removed through the first windows 109 of the first mask 108 so as to expose the drift region 103. After etching, residual portions of the conductive layer 107 define gate regions 107a, spaced apart by openings 110 and separated from the drift region 103 by gate-oxide regions 105a. In addition, the gate regions 107a are connected to one another through a continuous portion 107b, as shown in FIG. 4 (here the first mask 108 is not illustrated).

Next (FIG. 5), a P-type dopant species is introduced into the drift region 103 through the openings 110 and made to diffuse by means of a thermal process. Given that the dopant species diffuses in a substantially isotropic way, body regions 112 are formed, of a P$^-$-type, which extend laterally on the outside of respective windows 110 and reach a pre-set depth. Portions of the body region immediately underlying the respective gate-oxide regions 105a define channel regions 113 (represented with a dashed line in FIG. 5).

The first mask 108 is removed, and in its place a second mask 114 is provided, as shown in FIG. 6. On each body region 112, the second mask 114 has two second windows 115, which extend in a direction perpendicular to the plane of the drawing. The second windows 115 leave respective strips exposed and are aligned to respective gate regions 107a, which delimit the body region 112.

Then, an N$^+$-type implantation is carried out using the second mask 114. In this step, through the second windows 115 of the second mask 115, source regions 117 of an N$^+$-type are formed, having, for example, a level of doping of $10^{20}$ atoms/cm$^3$. In each body region 112 two source regions 117 are made, aligned to respective gate regions 110. The channel regions 113 are defined between the source regions 117 and the drift region 103, immediately underneath the gate-oxide regions 105a.

With reference to FIG. 7, after removal of the second mask 114, a third mask 118 is defined, having third windows 120 that expose at the centre strips of respective body regions 112, but coat at least in part the source regions 117. Also the windows 120 extend in a direction perpendicular to the plane of the drawing. The third mask 118 is then configured so as to leave a margin of distance L between the exposed part of the body region 112 and the gate regions 107a.

Using the third mask 118, a surface implantation of a P$^+$-type is first carried out so as to create a surface implant region 121 of a P$^+$-type, having approximately the same doping level as the source regions 117 (approximately $10^{20}$ atoms/cm$^3$), but opposite conductivity. Furthermore, the energy of the implantation is such that the peak of the doping density of the surface implant region 121 is found slightly underneath the source regions 117.

As shown in FIGS. 8-11, a plurality of P-type deep implantations (four in the embodiment described herein) are then carried out, once again using the third mask 118. Each implantation is performed at an higher energy than the previous one; hence the dopant species implanted penetrate to a greater depth in the body regions 112, thus forming a conduction region 124 that defines a continuous, high-conductivity path throughout the body region 112, in a direction perpendicular to the surface 103a of the drift region 103.

Figure 9:
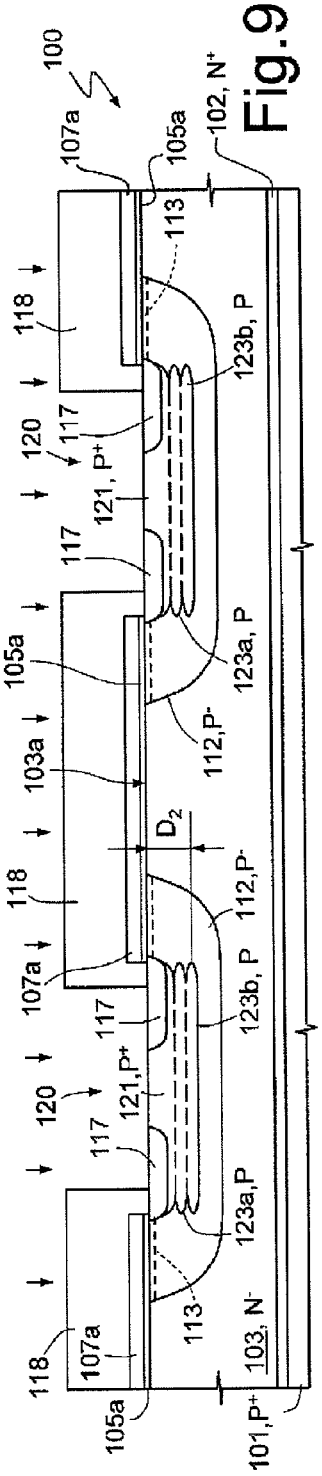
Figure 10:
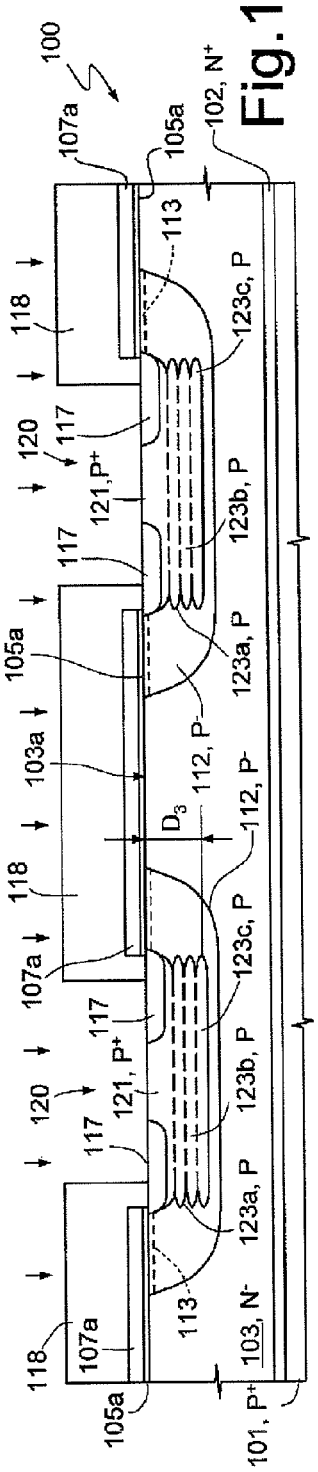

In detail (FIG. 8), following upon the first deep implantation, a first buried implant region 123a is provided, underneath the surface implant region 121 and contiguous thereto (at a depth D1). The second and third deep implantations (FIGS. 9 and 10) give rise to a second deep implant region 123b and to a third deep implant region 123c, respectively, at increasing depths D2, D3 from the surface 103a of the drift region 103, as shown in FIGS. 9 and 10. Finally (FIG. 11), the fourth implantation is carried out at the maximum energy as compared to the previous ones and forms a fourth deep implant region 123d at a depth D4, contiguous to the drift region 103.

The buried implant regions 123a-123d are arranged at increasing depths, are contiguous to one another and moreover have an intermediate doping level between the body region 112 and the surface implant region 121 (for example, approximately $10^{19}$ atoms/cm$^3$). Consequently, the conduction region 124, comprising the buried implant regions 123a-123d and the surface implant region 121, defines a continuous conductive path through the body region 112 in a direction perpendicular to the surface 103a of the drift region 103. The conduction region 124 has a resistance smaller than the body region 112.

At the end of the sequence of implantations, the third mask 118 is removed, and an ultra-rapid thermal process is carried out, for example bringing the wafer 100 to a temperature of between 1000° C. and 1150° C. for 10-30 s. During the ultra-rapid thermal process, the dopant species introduced into the wafer 100 are electrically activated, but do not have enough time to diffuse and consequently remain where they are.

With reference to FIG. 12, a dielectric layer 125, for example, a silicon-oxide layer, is then deposited and selectively etched in order to define insulating regions, which incorporate the gate regions 107a and leave the body regions 112 and portions of the source regions 117 exposed. In addition, in a way known and not shown, the dielectric layer 125 is opened also on top of the gate regions 107a in areas which are to form emitter electrical contacts.

Then, a metal layer is deposited and delineated by a photolithographic process in order to provide an emitter line 126, which extends within the openings 110 and electrically connects the body regions 112 and the source regions 117 to one another. In addition, also a gate line 127 is defined, connected to the gate regions 107a (FIG. 13).

Finally (FIG. 14), the substrate 101 is thinned to a predetermined thickness and coated with a metal layer forming a collector electrode 128. The wafer 100 is divided up into dice, each of which comprises a respective IGBT transistor 130 having the structure illustrated in FIG. 14.

The process described advantageously enables provision of an IGBT transistor in which latch-up of the intrinsic parasitic thyristor requires a particularly high current density. In fact, the highly conductive paths traversing entirely the body regions 112 enable drawing high currents without causing any significant voltage drops between the body regions 112 themselves and the source regions 117 housed therein.

In addition, doping of the channel regions 113 is preserved. The deep implantations are, in fact, carried out maintaining a margin of distance from the respective gate regions 107, which delimit the channel regions 113. The dopant species introduced into the body regions are subjected to inevitable phenomena of scattering associated to the implantation, and hence the surface implant region 121 and deep implant regions 123a-123b can be slightly misaligned with respect to the third mask 118. However, the margin of distance is sufficient to prevent the dopant species from reaching the channel regions 113, thus maintaining the doping substantially unaltered. Consequently, also the threshold voltage can be controlled easily.

Finally, it is evident that modifications and variations can be made to the IGBT transistor and to the manufacturing process described herein, without departing from the scope of the present invention, as defined in the annexed claims.

In particular, the conductive path through the body regions 112 can be obtained by an arbitrary number of implantations. In addition, the deep implants could be obtained starting from the deepest, then decreasing the implantation energy, or even in any other arbitrary order.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing an IGST transistor, comprising:
   providing, in a semiconductor wafer, a drift region;
   forming, in said drift region, a body region having a first type of conductivity;
   forming a conduction region, crossing said body region in a direction perpendicular to a surface of said drift region and having said first type of conductivity and a resistance lower than that of said body region, wherein forming said conduction region comprises carrying out a plurality of implantations having matching target concentrations of dopant species in said body region at different target depths from said surface of said drift region using the same mask and increasing energy levels for each implantation;
   removing the mask; and
   subjecting the semiconductor wafer to a thermal process at a time duration to activate electrically the implanted dopant species without diffusion.

2. The process of claim 1, wherein:
   the conduction region has a first side and a second side opposite the first side;
   forming the conduction region comprises carrying out the plurality of implantations at the first side to form a plurality of doped regions in the conduction region; and
   forming the conduction region by carrying out the plurality of implantations comprises forming the conduction region having a conductivity that is constant across the conduction region from the first side to the second side and through the plurality of doped regions of the conduction region.

3. The process of claim 2, wherein forming the conduction region having a conductivity that is constant across the conduction region from the first side to the second side comprises forming the conduction region having a dopant concentration that is a gradient from the first side to the second side and through the plurality of doped regions of the conduction region.

4. The process of claim 2, wherein carrying out the plurality of implantations at the first side to form a plurality of doped regions in the conduction region comprises forming the plurality of doped regions as a contiguous sequence of doped regions within the conduction region, the contiguous sequence of doped regions extending from the first side to the second side of the conduction region.

5. The process according to claim 1, wherein carrying out a plurality of implantations comprises carrying out a surface implantation for forming a surface implant region and a plurality of deep implantations for forming respective deep implant regions.

6. The process according to claim 5, wherein said conduction region has a higher doping level than said body region.

7. The process according to claim 6, wherein said implant regions have an intermediate doping level between said body region and that of said surface implant region.

8. The process according to claim 1, wherein said drift region has a second type of conductivity, opposite to said first type of conductivity.

9. The process according to claim 1, wherein a duration of said thermal process is between 10 s and 30 s.

10. The process according to claim 1, wherein said thermal process comprises heating said semiconductor wafer up to a temperature of between 1000° C. and 1150° C.

11. The process according to claim 1, comprising:
    forming a gate-oxide layer on said drift region;
    depositing a conductive polysilicon layer on said gate-oxide layer; and
    shaping said conductive layer and said gate-oxide layer for forming gate regions, separated from said drift region by respective gate-oxide regions and defining openings above said drift region.

12. The process according to claim 11, wherein said forming said body region comprises:
    introducing dopant species into said drift region through said openings; and
    diffusing the dopant species introduced.

* * * * *

UNITED STATES PATENT AND TRADEMARK OFFICE
CERTIFICATE OF CORRECTION

| | | |
|---|---|---|
| PATENT NO. | : 9,240,457 B2 | Page 1 of 1 |
| APPLICATION NO. | : 14/162200 | |
| DATED | : January 19, 2016 | |
| INVENTOR(S) | : Patti et al. | |

It is certified that error appears in the above-identified patent and that said Letters Patent is hereby corrected as shown below:

IN THE CLAIMS

Column 5, Line 38,   Delete: "IGST"
Claim 1              Insert --IGBT--

Signed and Sealed this
Nineteenth Day of April, 2016

Michelle K. Lee
*Director of the United States Patent and Trademark Office*